(12) United States Patent
Donders et al.

(10) Patent No.: US 9,952,514 B2
(45) Date of Patent: Apr. 24, 2018

(54) LITHOGRAPHIC APPARATUS AND DEVICE MANUFACTURING METHOD

(71) Applicant: ASML NETHERLANDS B.V., Veldhoven (NL)

(72) Inventors: Sjoerd Nicolaas Lambertus Donders, 's-Hertogenbosch (NL); Bob Streefkerk, Tilburg (NL); Martinus Hendrikus Antonius Leenders, Rotterdam (NL)

(73) Assignee: ASML NETHERLANDS B.V., Veldhoven (NL)

( * ) Notice: Subject to any disclaimer, the term of this patent is extended or adjusted under 35 U.S.C. 154(b) by 73 days.

(21) Appl. No.: 14/473,795

(22) Filed: Aug. 29, 2014

(65) Prior Publication Data

US 2015/0055104 A1   Feb. 26, 2015

Related U.S. Application Data

(63) Continuation of application No. 13/369,982, filed on Feb. 9, 2012, now Pat. No. 8,848,165, which is a
(Continued)

(51) Int. Cl.
*G03B 27/54* (2006.01)
*G03B 27/42* (2006.01)
*G03F 7/20* (2006.01)

(52) U.S. Cl.
CPC .................. *G03F 7/70341* (2013.01)

(58) Field of Classification Search
CPC ............... G03F 7/2041; G03F 7/70341; G03F 7/70325; G03F 7/70358; G03F 7/70375

USPC ............... 355/30, 52, 53, 55, 67–71, 72, 77; 250/492.1, 492.2, 492.22, 548; 430/5, 8, 430/22, 30, 311
See application file for complete search history.

(56) References Cited

U.S. PATENT DOCUMENTS 3,573,975 A   4/1971   Dhaka et al.
3,648,587 A   3/1972   Stevens
(Continued)

FOREIGN PATENT DOCUMENTS

DE   206 607   2/1984
DE   221 563   4/1985
(Continued)

OTHER PUBLICATIONS

English translation of DD 221 563, publised on Apr. 24, 1985.*
(Continued)

*Primary Examiner* — Christina Riddle
(74) *Attorney, Agent, or Firm* — Pillsbury Winthrop Shaw Pittman LLP

(57) ABSTRACT

An immersion lithography apparatus is disclosed in which liquid is supplied to a space between a projection system and a substrate, and a plate structure is provided to divide the space into two parts. The plate structure has an aperture to allow transmission of the projection beam, has through holes in it to reduce the damping effect of the presence of the plate and optionally has one or more inlets and outlets to provide various flows around the aperture in the plate. An embodiment of the invention may reduce the transportation of contaminants, stray light, temperature gradients, and/or the effect of bubbles on the imaging quality.

20 Claims, 4 Drawing Sheets

Related U.S. Application Data continuation of application No. 12/314,075, filed on Dec. 3, 2008, now Pat. No. 8,120,749, which is a continuation of application No. 11/167,564, filed on Jun. 28, 2005, now Pat. No. 7,474,379.

(56) References Cited

U.S. PATENT DOCUMENTS

| | | |
|---|---|---|
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,121,256 A | 6/1992 | Corle et al. |
| 5,610,683 A | 3/1997 | Takahashi |
| 5,825,043 A | 10/1998 | Suwa |
| 5,900,354 A | 5/1999 | Batchelder |
| 6,191,429 B1 | 2/2001 | Suwa |
| 6,236,634 B1 | 5/2001 | Lee et al. |
| 6,600,547 B2 | 7/2003 | Watson et al. |
| 6,603,130 B1 | 8/2003 | Bisschops et al. |
| 7,474,379 B2 | 1/2009 | Donders et al. |
| 2002/0020821 A1 | 2/2002 | Van Santen et al. |
| 2002/0163629 A1 | 11/2002 | Switkes et al. |
| 2003/0123040 A1 | 7/2003 | Almogy |
| 2004/0000627 A1 | 1/2004 | Schuster |
| 2004/0075895 A1 | 4/2004 | Lin |
| 2004/0114117 A1 | 6/2004 | Sleeker |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0207824 A1* | 10/2004 | Lof .................. G03F 7/70341 355/30 |
| 2004/0211920 A1 | 10/2004 | Derksen et al. |
| 2004/0239954 A1 | 12/2004 | Bischoff |
| 2004/0257544 A1 | 12/2004 | Vogel et al. |
| 2004/0263809 A1 | 12/2004 | Nakano |
| 2005/0007569 A1 | 1/2005 | Streefkerk et al. |
| 2005/0018155 A1 | 1/2005 | Cox et al. |
| 2005/0024609 A1 | 2/2005 | De Smit et al. |
| 2005/0030497 A1 | 2/2005 | Nakamura |
| 2005/0046813 A1 | 3/2005 | Streefkerk et al. |
| 2005/0046934 A1 | 3/2005 | Ho et al. |
| 2005/0052632 A1 | 3/2005 | Miyajima |
| 2005/0094116 A1 | 5/2005 | Flagello et al. |
| 2005/0094125 A1 | 5/2005 | Arai |
| 2005/0122505 A1 | 6/2005 | Miyajima |
| 2005/0132914 A1 | 6/2005 | Mulkens et al. |
| 2005/0134817 A1 | 6/2005 | Nakamura |
| 2005/0140948 A1 | 6/2005 | Tokita |
| 2005/0146693 A1 | 7/2005 | Ohsaki |
| 2005/0146694 A1 | 7/2005 | Tokita |
| 2005/0151942 A1 | 7/2005 | Kawashima |
| 2005/0200815 A1 | 9/2005 | Akamatsu |
| 2005/0213065 A1 | 9/2005 | Kitaoka |
| 2005/0213066 A1 | 9/2005 | Sumiyoshi |
| 2005/0219489 A1 | 10/2005 | Nei et al. |
| 2005/0233081 A1 | 10/2005 | Tokita |
| 2005/0237504 A1 | 10/2005 | Nagasaka et al. |
| 2005/0259234 A1* | 11/2005 | Hirukawa .......... G03F 7/70341 355/53 |
| 2006/0038968 A1 | 2/2006 | Kemper et al. |
| 2006/0103817 A1 | 5/2006 | Ten Kate et al. |
| 2006/0158628 A1 | 7/2006 | Liebregts et al. |
| 2006/0221315 A1 | 10/2006 | Beckers et al. |
| 2006/0291060 A1* | 12/2006 | Shirai .................... G02B 1/105 359/582 |
| 2010/0195067 A1 | 8/2010 | Nagasaka et al. |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 298 A2 | 5/2004 |
| EP | 1 420 300 A2 | 5/2004 |
| EP | 1528433 A2 * | 5/2005 .......... G03F 7/70341 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 | 6/2004 |
| WO | WO 2004/053950 | 6/2004 |
| WO | WO 2004/053951 | 6/2004 |
| WO | WO 2004/053952 | 6/2004 |
| WO | WO 2004/053953 | 6/2004 |
| WO | WO 2004/053954 | 6/2004 |
| WO | WO 2004/053955 | 6/2004 |
| WO | WO 2004/053956 | 6/2004 |
| WO | WO 2004/053957 | 6/2004 |
| WO | WO 2004/053958 | 6/2004 |
| WO | WO 2004/053959 | 6/2004 |
| WO | WO 2004053955 A1 * | 6/2004 .......... G03F 7/70341 |
| WO | WO 2004/055803 | 7/2004 |
| WO | WO 2004/057589 | 7/2004 |
| WO | WO 2004/057590 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | 2005/020298 | 3/2005 |
| WO | WO 2005/024517 | 3/2005 |
| WO | WO 2005020298 A1 * | 3/2005 .......... G02B 1/105 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

BJ. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 ( 2003).

M. Switkes et al., "Immersion Lithography: Optics for the 50 nm Node", 157 Anvers-1, Sep. 4, 2002.

Nikon Precision Europe GmbH, "Investor Relations—Nikon's Real Solutions", May 15, 2003.

(56) References Cited

OTHER PUBLICATIONS

H. Kawata et al., "Optical Projection Lithography using Lenses with Numerical Apertures Greater than Unity", Microelectronic Engineering 9 (1989), pp. 31-36.

J.A. Hoffnagle et al.; "Liquid Immersion Deep-Ultraviolet Interferometric Lithography", J. Vac. Sci, Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2pm Fine Patterns Using Optical Projection Lithography with an Oil Immersion Lens", Jpn. J, Appl. Phys, vol. 31 (1992), pp. 4174-4177.

G. Owen et al., "1/8pm Optical Lithography", J. Vac. Sci, Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No, 11, Apr. 1985, p. 6521.

A. Suzuki, "Lithography Advances of Multiple Fronts", EEdesign, EE Times, Jan. 5, 2004.

B. Lin, The $k_3$ coefficient in nonparaxial λ/NA scaling equations for resolution, depth of locus, and immersion lithography, *J. Microlith., Microfab., Microsyst.* 1(1)7-12 (2002).

English translation of JP 2004-193252 (dated Jul. 8, 2004).

Information Disclosure Statement as filed in U.S. Appl. No. 12/662,171 on Apr. 2, 2010.

\* cited by examiner

Fig. 2
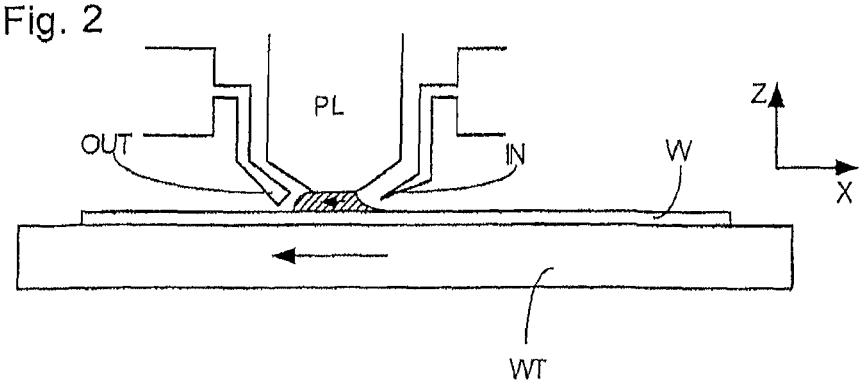
Fig. 3
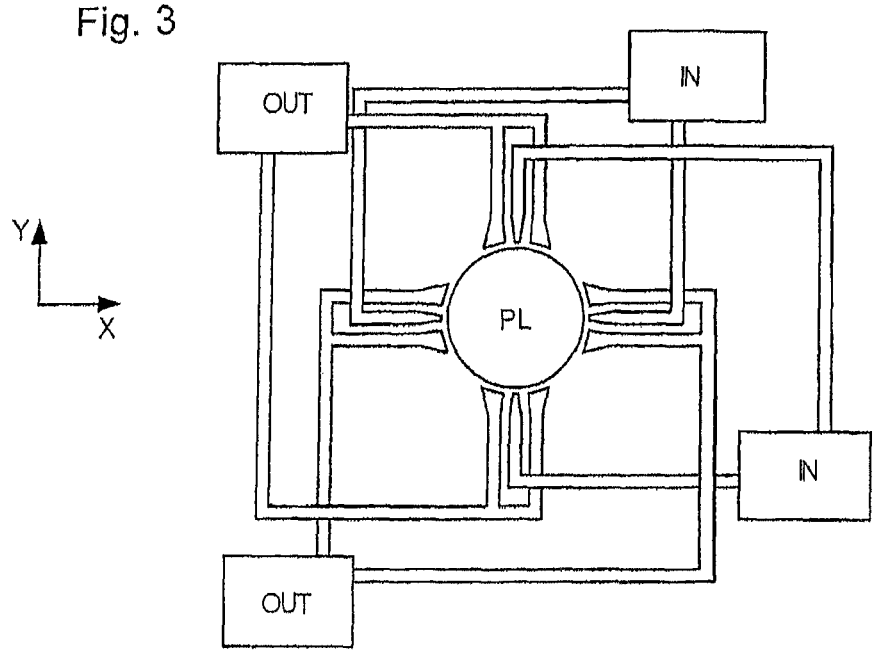
Fig. 4
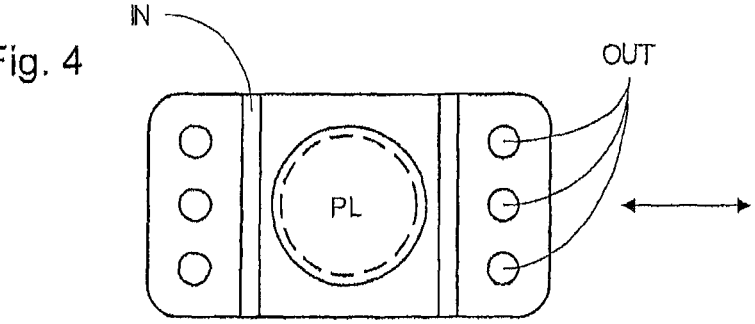
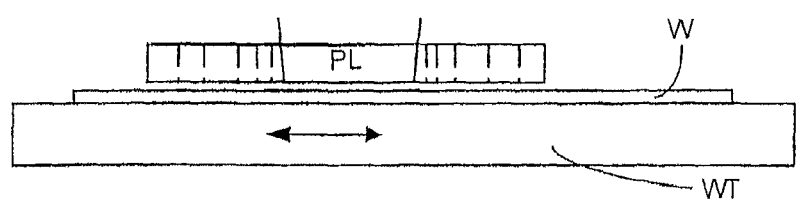

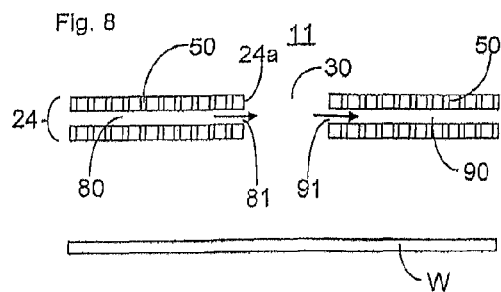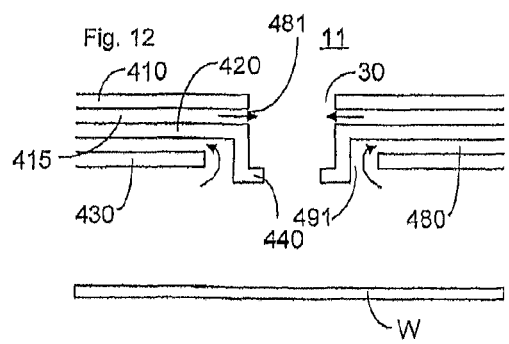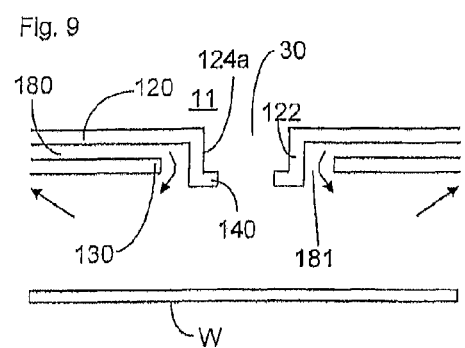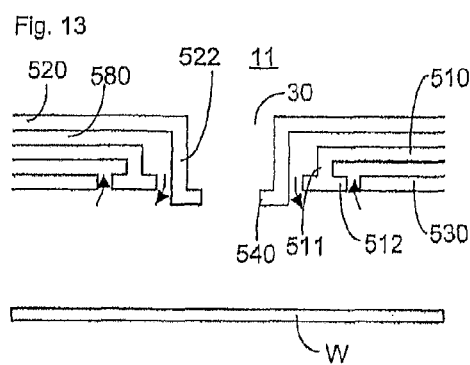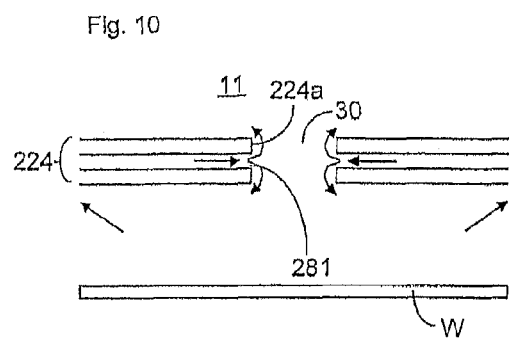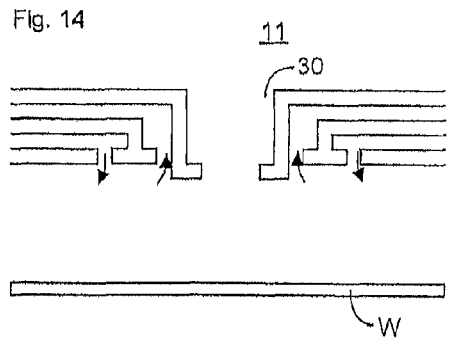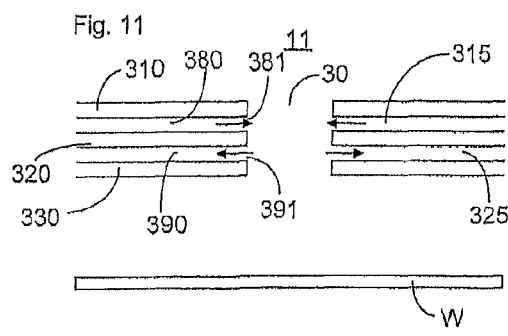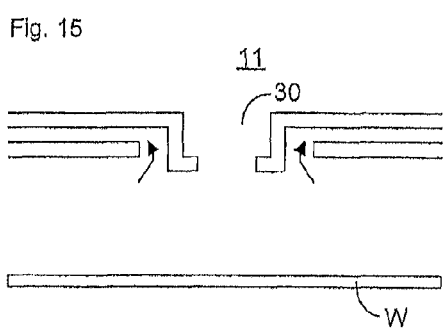

LITHOGRAPHIC APPARATUS AND DEVICE MANUFACTURING METHOD

This application continuation of U.S. patent application Ser. No. 13/369,982 filed on Feb. 9, 2012, now allowed, which is a continuation of U.S. patent application Ser. No. 12/314,075 filed on Dec. 3, 2008, now U.S. Pat. No. 8,120,749, which is a continuation of U.S. patent application Ser. No. 11/167,564 filed on Jun. 28, 2005, now U.S. Pat. No. 7,474,379. The entire contents of each of the foregoing applications is herein fully incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate (i.e. the space in which immersion liquid is present is smaller in plan than the substrate) and in between the final element of the projection system and the substrate using a liquid confinement system (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

In an immersion lithographic apparatus, bubbles in the immersion liquid may deleteriously affect the image quality produced by the apparatus. In addition or alternatively, temperature gradients in the immersion liquid may cause imaging defects because of the temperature dependency of the refractive index of the immersion liquid. Temperature gradients can arise because of absorption of the projection beam by the immersion liquid and because of heat transfer from other parts of the apparatus, such as the substrate or the liquid confinement system. Additionally or alternatively, the transportation of contaminants from the resist and/or top coat to the final element of the projection system by the immersion liquid may deleteriously affect image quality.

SUMMARY

It is desirable to provide an immersion lithography apparatus in which temperature gradients in the immersion liquid and the transportation of contaminants by the immersion liquid can be avoided and in which the chance of the image being deleteriously affected by bubbles in the immersion liquid during exposure is minimized or reduced.

According to an aspect of the present invention, there is provided a lithographic projection apparatus arranged to project a pattern from a patterning device onto a substrate through a liquid confined to a space adjacent the substrate, the apparatus comprising a first plate substantially parallel to the substrate to divide the space into two parts, the first plate having an aperture to allow transmission of the pattern onto the substrate and having a plurality of through holes to allow fluid communication between liquid above the plate and liquid below the plate through the through holes.

According to an aspect of the present invention, there is provided a lithographic projection apparatus arranged to project a pattern from a patterning device onto a substrate through a liquid confined in a space adjacent the substrate, the apparatus comprising a structure substantially parallel to the substrate to divide the space into two parts, the structure having an aperture to allow transmission of the pattern, an inlet to provide liquid to the space, and an outlet to remove liquid from the space.

According to an aspect of the present invention, there is provided a lithographic projection apparatus arranged to project a pattern from a patterning device onto a substrate through a liquid confined in a space adjacent the substrate, the apparatus comprising a structure substantially parallel to the substrate to divide the space into two parts, the structure having an aperture to allow transmission of the pattern and comprising three plates with an inlet, an outlet, or both, positioned between the plates.

According to an aspect of the present invention, there is provided a lithographic projection apparatus arranged to project a pattern from a patterning device onto a substrate through a liquid confined in a space adjacent the substrate, the apparatus comprising a structure substantially parallel to the substrate to divide the space into two parts, the structure having an aperture to allow transmission of the pattern and an inlet to provide liquid to the space, an outlet to remove liquid from the space, or both, the inlet, the outlet, or both, directed towards the substrate.

According to an aspect of the present invention, there is provided a device manufacturing method comprising projecting a patterned beam of radiation, through an aperture and a liquid provided in a space adjacent a substrate, onto the substrate, wherein a first plate substantially parallel to the substrate divides the space into two parts, the first plate having the aperture and a plurality of through holes to allow fluid communication between liquid above the plate and liquid below the plate through the through holes.

According to an aspect of the present invention, there is provided a device manufacturing method comprising projecting a patterned beam of radiation, through an aperture and a liquid provided in a space adjacent a substrate, onto the substrate, wherein a structure substantially parallel to the substrate divides the space into two parts, the structure having the aperture, an inlet to provide liquid to the space, and an outlet to remove liquid from the space.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIGS. 8-15 depict possible arrangements in embodiments of the invention.

DETAILED DESCRIPTION

Figure 1:
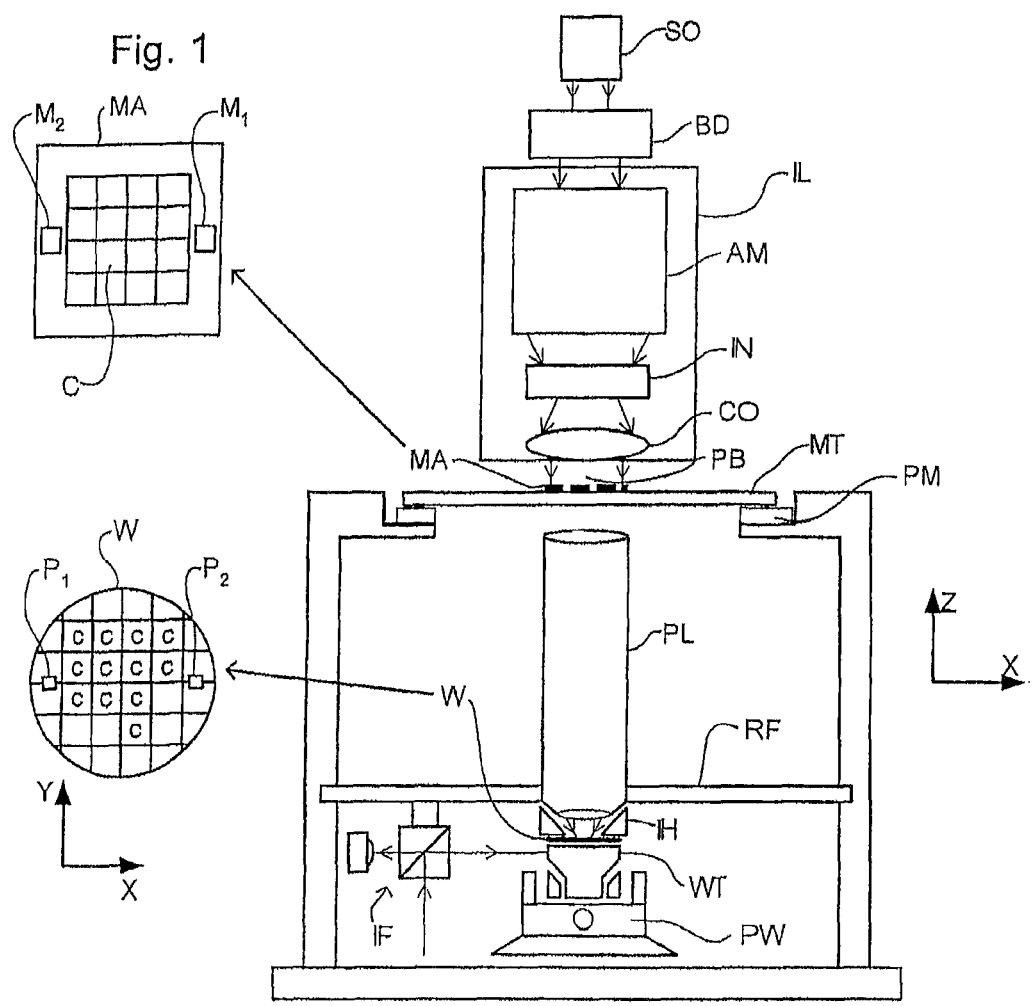
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam is incident on the patterning device (e.g., mask MA), which is held on the support structure (e.g., mask table MT), and is patterned by the patterning device. Having traversed the mask MA, the radiation beam passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam. Similarly, the first positioner PM and another position sensor (which is not explicitly depicted in FIG. 1) can be used to accurately position the mask MA with respect to the path of the radiation beam, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
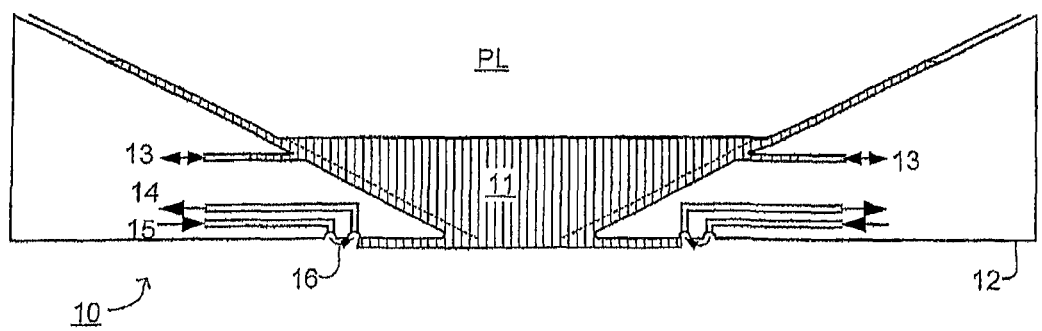
FIG. 5 depicts another liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate. In an embodiment, the seal is a contactless seal such as a gas seal. Such a system is disclosed in United States patent application publication no. US 2004-0207824 and European patent application publication no. EP 1420298, each hereby incorporated in its entirety by reference, and illustrated in FIG. 5.

As can be seen in FIG. 5, a reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

U.S. patent application Ser. No. 10/986,187, filed Nov. 12, 2004, which is incorporated herein in its entirety, discloses a system similar to that illustrated in FIGS. 6 and 7 for the supply of liquid in an immersion lithography apparatus.

Figure 6:
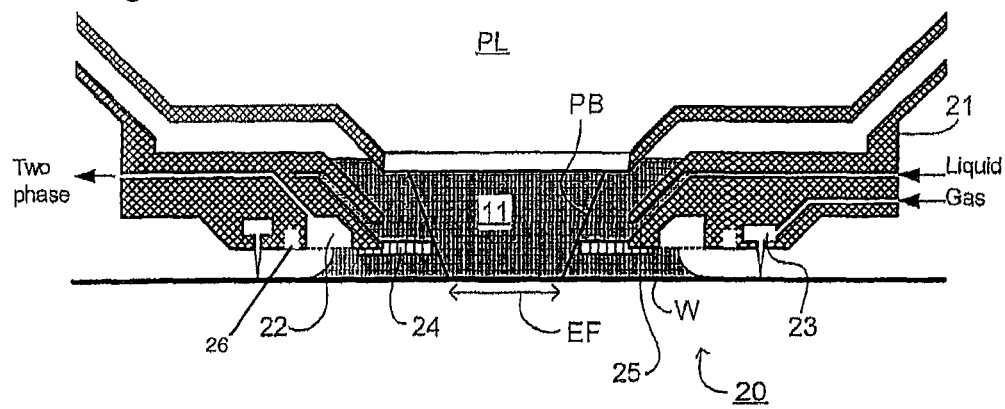
FIG. 6 depicts in section a liquid supply system according to an embodiment of the invention.
Figure 7:
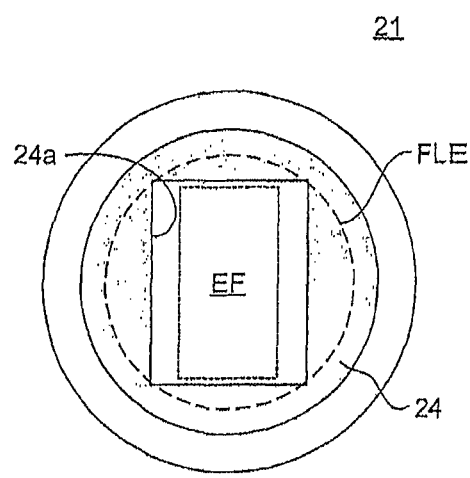
FIG. 7 depicts in plan the liquid supply system of FIG. 6.

FIGS. 6 and 7 show an immersion hood 20 (which may also be referred to as a liquid supply or confinement system) according to a particular embodiment of the invention. The immersion hood comprises a liquid confinement structure 21 which confines immersion liquid 11 to a space between the final element of the projection system PL and the substrate W. The liquid confinement structure 21 is borne above the substrate in U.S. patent application Ser. No. 10/986,187 about 30 to 300 μm (but may be more or less) and has a seal device 22 to restrict outflow of the immersion liquid 11. This may be a gas or liquid seal, using a flow of gas or liquid to confine the liquid 11, and may also act as a bearing for the liquid confinement structure which alternatively may be separately supported and/or actuated. The seal device 22 may simply be a low pressure extraction port to suck away liquid (and in the illustrated embodiment gas as well) flowing under the liquid confinement structure 21. A gas knife 23 may be provided to drive any residual film of liquid back towards seal and extraction device 22. The arrangement of the liquid confinement structure 21 may be as illustrated in U.S. patent application Ser. No. 11/098,615, filed 5 Apr. 2005, in particular regarding the bottom side of the liquid confinement structure 21 in which a single phase extractor is used and a recess 26 is positioned between the extractor and the gas knife and a mixture of gas and liquid is extracted through the recess.

To prevent or reduce transportation of contaminants from the resist and/or topcoat on the substrate and temperature gradients in the immersion liquid, e.g. ultra pure water, a plate 24 is provided to divide the space between the projection system PL and substrate W into two parts. The plate 24 has an aperture or window 24a to allow transmission of the projection beam PB, the aperture or window being slightly larger than the exposure field EF to accommodate the convergence of the projection beam from the projection system to the substrate.

In an embodiment of the invention, the plate 24 has an aperture 24a and the overall liquid supply 25 is arranged above the plate 24. This combined with the extraction of liquid by seal device 22 ensures a substantially constant flow of liquid from the part of the space adjacent the projection system to the part adjacent the substrate which ensures contaminants and liquid that has been heated or cooled by the substrate are quickly removed from the system. The space above the plate in FIG. 6 may be kept at a higher pressure than that below to ensure a suitable flow rate. Additional liquid extraction may be performed above the plate to ensure adequate refreshment of the liquid 11. Similarly, additional liquid supply below the plate may be provided as desired.

In an embodiment of the invention, the aperture may be closed by a transparent plate to form a window. The window should have a high transmissivity at the wavelength of the projection system and, in an embodiment, a refractive index as close as possible to that of the immersion liquid. The window should be sufficiently flat and plane parallel to enable desired imaging requirements to be met. In such an embodiment, liquid supply and extraction ports are provided on both sides of the plate 24.

In an embodiment of the invention, the plate 24 should be made of a material having sufficient mechanical strength and desirably a low thermal conductivity. Suitable materials include: steel, stainless steel, ceramic, glass and quartz, as well as low CTE materials such as Zerodur™, ULE™, and Invar™. The plate need not be attached to the liquid confinement structure 21 but may also be separately supported.

An advantage of the plate 24 is that it blocks stray light which may reduce the contrast in the projected image and to enhance this effect, an absorptive coating may be provided on the plate. A hydrophobic and/or hydrophilic coating may be provided, in addition or alternatively, to control the liquid flow and a different coating may be used on each side of the plate. Especially if the plate 24 is thick, the edge of the aperture 24a may be beveled to allow the aperture to more closely conform to the shape of the projection beam. If desired multiple plates may be used to divide the space into more than two parts.

In an embodiment, the plate 24 is positioned as close as possible to the substrate but for safety should be sufficiently far away to avoid contact with the substrate, even in exceptional circumstances.

One or more embodiments of the present invention disclosed herein is directed to improvements to the subject matter disclosed in U.S. patent application Ser. No. 10/986,187, in particular steps are taken to reduce or minimize the deleterious effect of bubbles in the space with the immersion liquid 11 affecting imaging of the substrate and to reduce or minimize the damping effect which can occur due to the presence of the plate 24 during movement, particular in the Z-axis, of the substrate W relative to the projection system PL. The measures employed to address this issue are illustrated in the arrangement of plate 24 in FIG. 8.

In FIG. 8, it can clearly be seen that the plate 24 has a plurality of through holes 50 extending in the vertical axis or substantially parallel to the optical axis of the projection system. These through holes 50 are shaped such that they promote flow of immersion liquid through the holes on a relative movement of the plate 24 to the immersion liquid in the vertical direction but that the immersion liquid does not tend to pass through the through holes 50 if the immersion liquid is moving horizontally past the plate. In this way the function of the plate 24 to separate the space of the immersion liquid 11 into two parts is maintained whilst if the liquid supply system or the projection system needs to move closer to the substrate the effect of the plate 24 in damping the motion due to interaction with the immersion liquid 11 is reduced. Thus it can be seen that the through holes 50 allow an impulse from the immersion liquid 11 underneath the plate 24 to be transferred to liquid above the plate 24. This is because the holes allow fluid communication between liquid above and liquid below the plate 24. A little flow of immersion liquid through the through holes 50 may also occur but as the relative movement of the substrate, liquid confinement structure 21 and projection system PL is small (of the order of several microns), not much flow occurs. The through holes 50 are typically about 40 μm in diameter but may be up to 2 mm in diameter. The damper area (i.e. sum of the areas of the through holes) is the important factor. For 40 μm diameter holes, a pitch of about 3.5 mm is about right. This covers about 5 to 10% of the area.

Also illustrated in FIG. 8 is a first flow channel 80 through which immersion liquid can be provided via an outlet 81 into the space of the immersion liquid 11. A corresponding second flow channel 90 on the other side of the aperture 30 starts at an inlet 91 so that immersion liquid can be removed from the space. In particular in FIG. 8, flow of immersion liquid through the flow channels in the plate 24 is arranged such that it is across the aperture 30 from one side to the other. In an embodiment, the through flow is arranged to be as close as possible to laminar to avoid recirculation of immersion liquid. Arranging for such a flow across the aperture has the effect of reducing the presence of bubbles in the aperture; bubbles tend to be produced at the interface between the immersion liquid and the substrate W during relative movement of the immersion liquid and the substrate W, for example, during scanning of the substrate. By providing a substantially constant flow of immersion liquid across the aperture 30, the migration of the bubbles to the aperture produced by the scanning motion below the plate 24 may be minimized.

If the size of the through holes 50 is small, this can lead to difficulties in filling of the liquid confinement structure 21 with immersion liquid, particularly with gas entrapment. One solution is to increase the through hole 50 size such that bubbles do not get trapped underneath the plate 24 during filling. Another solution is to provide an under pressure (about −40 mbar is suitable for 40 μm diameter through holes) to the flow channels 80, 90 after filling of the liquid confinement structure 21 with immersion liquid to extract bubbles trapped under the plate 24 through the flow channels 80, 90.

The embodiment illustrated in FIG. 8 has been described above as comprising a single plate 24. However, it will be appreciated that the embodiment could equally well be described as being formed of two or more plates with a flow channel between a first upper plate and a second lower plate. Typically the two or more plates might be of 0.1 mm thickness with a gap between them of 0.3 mm. In this present embodiment, the distance between the final element of the projection system PL and the substrate W is arranged to be of the order of 1 to 5 mm which is larger than that described in U.S. patent application Ser. No. 10/986,187. This is arranged for so that during exchange of one substrate for another it is possible to move the liquid supply system up towards the projection system PL and this negates the need to move the substrate table WT down away from the projection system PL during substrate swap.

Therefore it can be seen that the plate 24 has an immersion liquid inlet and a immersion liquid outlet.

The embodiments of FIGS. 9-15 are not illustrated with through holes in the one or more plates. Any of the embodiments may incorporate such through holes if desired and they are only not illustrated in the figures for clarity purposes. Indeed, the embodiment of FIG. 8 may also work well without the presence of through holes 50.

A further embodiment in which a structure which is substantially parallel to the substrate and which divides the space into two parts is provided comprises two plates namely an upper plate 120 and a lower plate 130 as illustrated in FIG. 9. The aperture in the lower plate 130 is created to be larger than that in the upper plate 120. The upper plate 120 has a smaller aperture and has at its radially inwardly end a downwardly extending portion 122 (to direct flow downwards) which forms side walls 124a of the aperture 30 before extending radially inwardly again to form a lip 140 which forms the narrowest part of the aperture 30. By positioning the upper plate 120 over the lower plate 130 and arranging for the gap between the two plates to form a flow channel 180, an outlet 181 which extends in a peripheral loop around the aperture 30 is produced and which is directed downwards towards the substrate W. This arrangement may be particularly effective at clearing the pathway through the immersion liquid of the patterned projection beam PB of bubbles which are formed at the interface between the immersion liquid and the substrate and the environment. The flow of liquid indicated by arrows in FIG. 9 helps to ensure that liquid comprising bubbles is moved out of the center of the space of the immersion liquid 11. Liquid is provided above the upper plate 120 and flows downwards through the aperture 30. This liquid which is provided to the space from above the upper plate 120 is generally freer of bubbles than liquid below the lower plate 130 so that this arrangement has the effect of providing a clear path for the patterned beam through the immersion liquid without obstruction by bubbles.

The effect of the lip 140 is that it accelerates immersion liquid passing through the aperture from above thereby making the flow more homogeneous.

The embodiment illustrated in FIG. 10 is similar to that illustrated in FIG. 8 except that the plate 224 is not arranged to have a liquid outlet, rather a peripheral liquid inlet 281 is provided around the inner periphery 224a of the aperture 30. The arrows in FIG. 10 illustrate the flow of immersion liquid.

FIG. 11 illustrates a further embodiment in which a third plate is added to the structure which divides the space. In this case an upper plate 310 is provided which is separated from a middle plate 320 which is in turn separated from a lower plate 330. Thus the upper and lower plates 310, 330 sandwich the middle plate 320. Flow channels are provided between the upper plate 310 and the middle plate 320 and between the middle plate 320 and the lower plate 330. Any arrangement of inlets and outlets may be used so long as at least one inlet is present and at least one outlet is present. In the illustrated embodiment it is shown that the flow channels 315, 380 end in inlets 381 and the flow channels 325, 390 between the middle and lower plates end in outlets 391. However, it is possible for the left hand side flow channels to end in outlets and the right hand side channels to end in inlets so that substantially parallel flow across the aperture 30 is provided. Other arrangements will be clear to the skilled person.

The embodiment of FIG. 12 is similar to that of FIG. 9 except that the structure which divides the space has had a further top plate 410 added. A further flow channel 415 is formed between the top plate 410 and the middle plate 420 which is the top plate 120 in FIG. 9. Liquid is provided through inlet(s) 481 which is in fluid communication with the flow channel 415 to the aperture 30 and, contrary to what is illustrated in FIG. 9, the flow channel 480 between the middle 420 and lower 430 plates comprises inlet(s) 491 so that a flow of immersion liquid into the aperture 30 around the bottom of the lip 440 and into the inlet(s) 491 is provided. This circular flow of liquid in the aperture 30 may be particularly good at keeping bubbles from migrating from the remainder of the space of the immersion liquid 11 into the aperture 30.

A further embodiment is illustrated in FIG. 13. In this embodiment a top plate 520 is provided which has a downwardly extending wall 522 which extends such that the lower lip 540 extends below the bottom surface of a middle plate 510 and bottom plate 530. The middle plate 510 also has a downwardly extending portion 511 and is terminated by a T-portion 512 which extends lips on either side of the downwardly extending portion 511. Again flow channels are formed between the top plate 520 and the middle plate 510 and between the middle plate 510 and the bottom plate 530. In the illustrated embodiment the flow channel 580 between the top 520 and middle 510 plates ends in an outlet and the other channel 590 between the middle 510 and bottom 530 plates ends in an inlet such that the outlet is positioned radially inwardly relative to the inlet. However, this situation may be reversed and indeed it may be arranged that the flow channels on the left hand side end in outlets and those on the right hand side start as inlets so that a flow of immersion liquid across the bottom of the aperture 30 is provided. Indeed, the embodiment in FIG. 14, which is otherwise the same as that of FIG. 13 has the position of the inlet and outlets reversed and this may be effective in sucking out bubbles from the remainder of the space below the bottom plate. For this purpose it may be advantageous to have the top plate extending below the bottom surface of the bottom plate 430 as is illustrated.

The embodiment illustrated in FIG. 15 is the same as that of FIG. 9 except that the outlet 181 is now formed as an inlet. This embodiment may be particularly good at extracting bubbles from the immersion liquid trapped beneath the bottom plate 130.

In an embodiment, there is provided a lithographic projection apparatus arranged to project a pattern from a patterning device onto a substrate through a liquid confined to a space adjacent the substrate, the apparatus comprising a first plate substantially parallel to the substrate to divide the space into two parts, the first plate having an aperture to allow transmission of the pattern onto the substrate and having a plurality of through holes to allow fluid communication between liquid above the plate and liquid below the plate through the through holes.

In an embodiment, the through holes are shaped and/or distributed and/or dimensioned for the transfer of an impulse from liquid below the plate to liquid above the plate. In an embodiment, the apparatus further comprises a second plate in the space and substantially parallel to the first plate. In an embodiment, the second plate has a plurality of through holes to allow the flow of liquid therethrough. In an embodiment, a flow channel substantially parallel to the substrate to allow flow of liquid exists in or adjacent the first plate. In an embodiment, the flow channel is arranged to create a flow of liquid in and adjacent the aperture to substantially prevent bubbles in liquid in another area of the space from migrating into the aperture, to remove bubbles trapped underneath the plate, or both. In an embodiment, the another area of the space is an area between the first plate, the second plate, or both, and the substrate. In an embodiment, the flow channel has an outlet into the space configured to direct liquid in a direction not parallel to the substrate. In an embodiment, the apparatus further comprises a low pressure source configured to apply an under pressure to the flow channel to substantially remove bubbles in the liquid under the plate through the through holes. In an embodiment, the apparatus comprises a third plate in the space that is substantially parallel to the first and second plates.

In an embodiment, there is provided a lithographic projection apparatus arranged to project a pattern from a patterning device onto a substrate through a liquid confined in a space adjacent the substrate, the apparatus comprising a structure substantially parallel to the substrate to divide the space into two parts, the structure having an aperture to allow transmission of the pattern, an inlet to provide liquid to the space, and an outlet to remove liquid from the space.

In an embodiment, the inlet and outlet are arranged to promote liquid flow across the aperture. In an embodiment, the inlet forms a closed loop around the aperture, the outlet forms a closed loop around the aperture, or both. In an embodiment, the inlet is radially inward of the outlet. In an embodiment, the inlet is radially outward of the outlet. In an embodiment, the inlet is positioned further from the substrate than the outlet. In an embodiment, the inlet, the outlet, or both, is directed towards the substrate. In an embodiment, the structure comprises a lip which forms the narrowest part of the aperture, the remainder of the aperture being wider.

In an embodiment, there is provided a lithographic projection apparatus arranged to project a pattern from a patterning device onto a substrate through a liquid confined in a space adjacent the substrate, the apparatus comprising a structure substantially parallel to the substrate to divide the space into two parts, the structure having an aperture to allow transmission of the pattern and comprising three plates with an inlet, an outlet, or both, positioned between the plates.

In an embodiment, the inlet, the outlet, or both, are arranged to promote liquid flow across the aperture. In an embodiment, the inlet forms a closed loop around the aperture, the outlet forms a closed loop around the aperture, or both. In an embodiment, the inlet, the outlet, or both, is directed towards the substrate. In an embodiment, the structure comprises a lip which forms the narrowest part of the aperture, the remainder of the aperture being wider.

In an embodiment, there is provided a lithographic projection apparatus arranged to project a pattern from a patterning device onto a substrate through a liquid confined in a space adjacent the substrate, the apparatus comprising a structure substantially parallel to the substrate to divide the space into two parts, the structure having an aperture to allow transmission of the pattern and an inlet to provide liquid to the space, an outlet to remove liquid from the space, or both, the inlet, the outlet, or both, directed towards the substrate.

In an embodiment, the structure comprises a lip which forms the narrowest part of the aperture, the remainder of the aperture being wider.

In an embodiment, there is provided a device manufacturing method comprising projecting a patterned beam of radiation, through an aperture and a liquid provided in a space adjacent a substrate, onto the substrate, wherein a first plate substantially parallel to the substrate divides the space into two parts, the first plate having the aperture and a plurality of through holes to allow fluid communication between liquid above the plate and liquid below the plate through the through holes. In an embodiment, a second plate is substantially parallel to the first plate in the space.

In an embodiment, there is provided a device manufacturing method comprising projecting a patterned beam of radiation, through an aperture and a liquid provided in a space adjacent a substrate, onto the substrate, wherein a structure substantially parallel to the substrate divides the space into two parts, the structure having the aperture, an inlet to provide liquid to the space, and an outlet to remove liquid from the space.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a pattern from a patterning device onto a substrate through a liquid confined in a space adjacent the substrate, the apparatus comprising:
 a projection system configured to project the pattern onto the substrate, the projection system having an optical axis; and
 a liquid confinement structure configured to at least partly confine the liquid within the space, the liquid confinement structure comprising:
 a first plate structure extending substantially parallel to a top surface of the substrate, and
 a second plate structure that is substantially parallel to the first plate structure and is further in height from the top surface of the substrate than the first plate structure, the second plate structure defining at least in part an inlet opening to provide liquid to the space, the inlet opening facing toward the optical axis,
 wherein the first and second plate structures have an aperture to allow transmission of the pattern and of liquid, and wherein a flow channel is provided in between the first and second plate structures, the flow channel configured to allow an outward flow of liquid in a radial direction relative to the optical axis,
 wherein the inlet forms a closed loop around the aperture, an outlet of the flow channel forms a closed loop around the aperture, or both.

2. The apparatus according to claim 1, further comprising a further outlet provided in a bottom surface of the liquid confinement structure, the further outlet configured to extract a liquid filling at least partly a space between the bottom surface of the liquid confinement structure and the substrate.

3. The apparatus according to claim 1, wherein an outlet of the flow channel surrounds the aperture.

4. The apparatus according to claim 1, wherein the first plate structure is movable relative to the substrate.

5. The apparatus according to claim 1, wherein a bottom surface of the first plate structure forms part of a bottom surface of the liquid confinement structure.

6. The apparatus according to claim 1, wherein a channel extends diagonally with respect to the optical axis to the inlet opening to supply liquid to the inlet opening.

7. The apparatus according to claim 1, wherein the inlet is configured to provide a generally horizontal inward flow of liquid toward a center of the aperture.

8. A lithographic projection apparatus arranged to project a pattern from a patterning device onto a substrate through a liquid confined in a space adjacent the substrate, the apparatus comprising:
 a structure substantially parallel to the substrate to divide the space into two parts, the structure having an aperture to allow transmission of the pattern and of liquid, an inlet to provide liquid to the space, the inlet directed towards a path of radiation through the space, an outlet to remove liquid from the space, the outlet directed towards the path of radiation through the space, and a further outlet provided at a bottom surface of the structure, the further outlet configured to extract a liquid filling at least partly a space between the bottom surface of the structure and the substrate, wherein the structure is configured to allow a generally horizontal flow of the liquid from the outlet between an upper surface of the structure and a lower surface of another structure, and wherein the inlet provides liquid above the lower surface of the other structure.

9. The apparatus according to claim 8, wherein the outlet surrounds the aperture.

10. The apparatus according to claim 8, wherein the inlet is at least partly defined by the other structure.

11. The apparatus according to claim 8, wherein the structure is movable relative to the substrate.

12. The apparatus according to claim 8, wherein the edge of the structure at the aperture is beveled.

13. The apparatus according to claim 8, wherein the structure and the other structure are connected together to a common structure, such that the structure and the other structure are separated from a projection system configured to project the pattern onto the substrate.

14. The apparatus according to claim 8, wherein the inlet is configured to provide a generally horizontal inward flow of liquid toward a center of the aperture.

15. A lithographic projection apparatus arranged to project a pattern from a patterning device onto a substrate through a liquid confined in a space adjacent the substrate, the apparatus comprising:

a projection system configured to project the pattern onto the substrate, the projection system having an optical axis;

a liquid confinement structure configured to at least partly confine the liquid within the space, the liquid confinement structure comprising:

a first structure having an upper surface extending substantially parallel to a top surface of the substrate, a second structure having a lower surface above the first structure that is substantially parallel to the upper surface of the first structure, the second structure defining at least in part an inlet opening to provide liquid to the space, the inlet opening facing toward the optical axis, and a further outlet provided in a bottom surface of the liquid confinement structure, the further outlet configured to extract a liquid filling at least partly a space between the bottom surface of the liquid confinement structure and the substrate, wherein the first and second structures have an aperture to allow transmission of the pattern and of liquid, and wherein a flow channel is provided in between the upper surface of the first structure and the lower surface of the second structure, the flow channel configured to allow a generally horizontal outward flow of liquid relative to a center of the aperture, wherein the first structure is movable relative to the substrate.

16. The apparatus according to claim 15, wherein an outlet of the flow channel surrounds the aperture.

17. The apparatus according to claim 15, wherein a bottom surface of the first structure forms part of a bottom surface of the liquid confinement structure.

18. The apparatus according to claim 15, wherein the first structure and the second structure are connected together to a common structure, such that the first structure and the second structure are separated from the projection system.

19. The apparatus according to claim 15, wherein the edge of the first structure at the aperture is beveled.

20. The apparatus according to claim 15, wherein the inlet is configured to provide a generally horizontal inward flow of liquid toward a center of the aperture.

* * * * *